(12) United States Patent
Eiriksson et al.

(10) Patent No.: US 7,070,661 B2
(45) Date of Patent: Jul. 4, 2006

(54) UNIFORM GAS CUSHION WAFER SUPPORT

(75) Inventors: Ari Eiriksson, Brighton, MA (US); Richard Gueler, Hamilton, MA (US); Michel Pharand, Chelmsford, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 324 days.

(21) Appl. No.: 10/646,249

(22) Filed: Aug. 22, 2003

(65) Prior Publication Data

US 2005/0039685 A1 Feb. 24, 2005

(51) Int. Cl.
*H01L 21/00* (2006.01)
*C23C 16/00* (2006.01)

(52) U.S. Cl. .............. 118/725; 118/728; 118/724; 156/345.51; 156/345.52; 219/444.1; 219/544; 204/192.1; 204/298.01

(58) Field of Classification Search ................. 118/725, 118/724, 728; 156/345.52, 345.51; 204/192.1, 204/298.01; 219/444.1, 544
See application file for complete search history.

(56) References Cited

U.S. PATENT DOCUMENTS

| | | | |
|---|---|---|---|
| 4,857,689 A | 8/1989 | Lee | |
| 4,952,299 A | 8/1990 | Chrisos et al. | |
| 5,900,177 A | 5/1999 | Lecouras et al. | |
| 6,183,565 B1 * | 2/2001 | Granneman et al. | ........ 118/725 |
| 6,408,767 B1 | 6/2002 | Binnard et al. | |
| 2003/0178145 A1 * | 9/2003 | Anderson et al. | ...... 156/345.51 |

FOREIGN PATENT DOCUMENTS

JP   2002190715 A  *  7/2002
WO  WO 2002101806 A1  * 12/2002

* cited by examiner

Primary Examiner—Ram N Kackar
(74) Attorney, Agent, or Firm—Watts Hoffmann Co.,LPA

(57) ABSTRACT

A workpiece is supported on a gas cushion to reduce mechanical stresses on the workpiece during processing. A plenum having a workpiece support flange for receiving the workpiece is connected to a gas supply. When gas flows into the plenum and pressure increases sufficiently to lift the workpiece, the workpiece is lifted and the gas flows out of the plenum between the flange and the workpiece edge. The workpiece is thus supported above the flange by the gas during processing.

9 Claims, 3 Drawing Sheets

UNIFORM GAS CUSHION WAFER SUPPORT

TECHNICAL FIELD

The invention relates generally to the field of semiconductor wafer processing and more specifically to a vertical rapid thermal processing unit that includes a gas cushion wafer support assembly for positioning a wafer within the processing unit.

BACKGROUND OF THE INVENTION

Thermal processing systems are widely used in various stages of semiconductor fabrication. Basic thermal processing applications include chemical deposition, diffusion, oxidation, annealing, silicidation, nitridation, and solder re-flow processes. Vertical rapid thermal processing (RTP) systems have a vertically oriented processing chamber that is heated by a heat source such as a resistive heating element or a bank of high intensity light sources. An elevator tube is controlled to move a wafer on a wafer support vertically within the processing chamber. In some RTP systems, the heat sources create a temperature gradient within the processing chamber and temperature ramp-up and ramp-down rates of the wafer being processed are controlled by the vertical location of the wafer within the processing chamber. Therefore, to optimize the thermal processing of semiconductor wafers it is important to accurately control the position of the wafer within the processing chamber.

Prior art wafer supports, such as shown in FIG. 1, use pins, rings, or other hard surfaces to support the wafer during thermal processing. The prior art systems give rise to local contact type stresses and bending stresses. The silicon wafer yield strength decrease as a function of temperature. When the yield strength reaches the bending stress, microcracks may occur within the silicon crystal structure. This is detrimental at the point the wafer contacts the mechanical support. As processing temperatures increase, the potential for deformation becomes more significant.

SUMMARY OF THE INVENTION

A gas cushion provides uniform support for a workpiece being processed. To achieve the gas cushion, a plenum featuring a workpiece support flange is connected to a gas supply. When a workpiece is placed on the support flange and gas is supplied to the plenum, the inner diameter of the support flange coacts with the workpiece edge to define a gas flow path through which the supplied gas flows when the workpiece is lifted from the support flange. An edge ring may contact a workpiece edge and define the gas flow path in conjunction with the support flange. Loading structure may be associated with the plenum to separate the workpiece from the plenum for loading or unloading the workpiece from the plenum. The loading structure may feature pins that protrude through the plenum and contact a process chamber surface to be pushed toward and lift the workpiece when the plenum is in a position for loading or unloading.

DETAILED DESCRIPTION OF THE PREFERRED EMBODIMENTS

Figure 1:
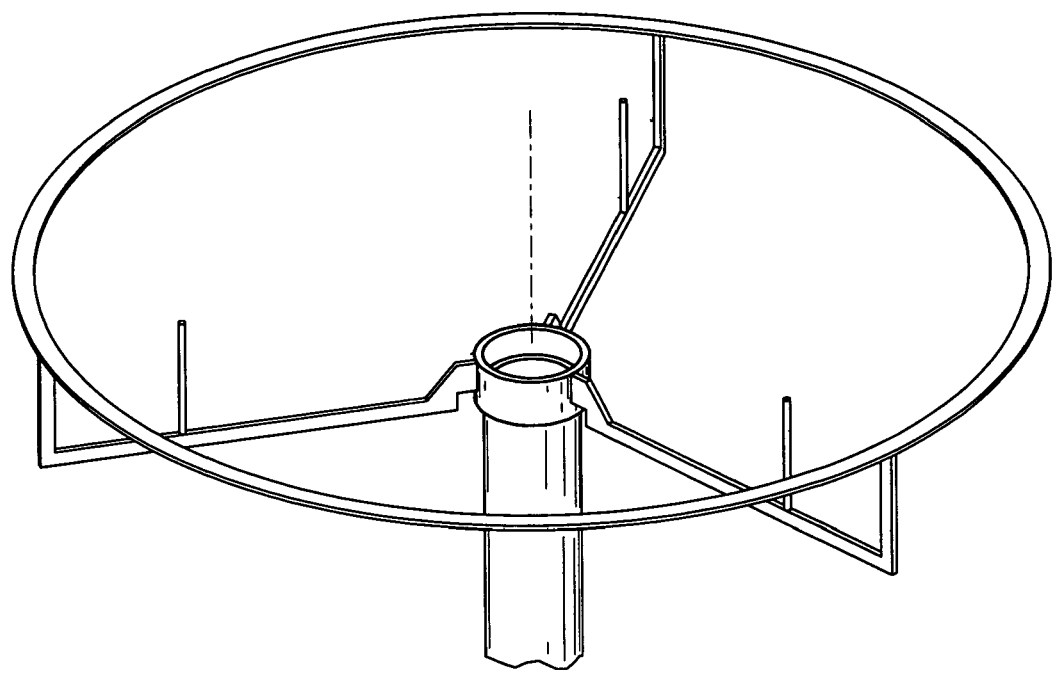
FIG. 1 is a perspective view of a prior art wafer support system.
Figure 2:
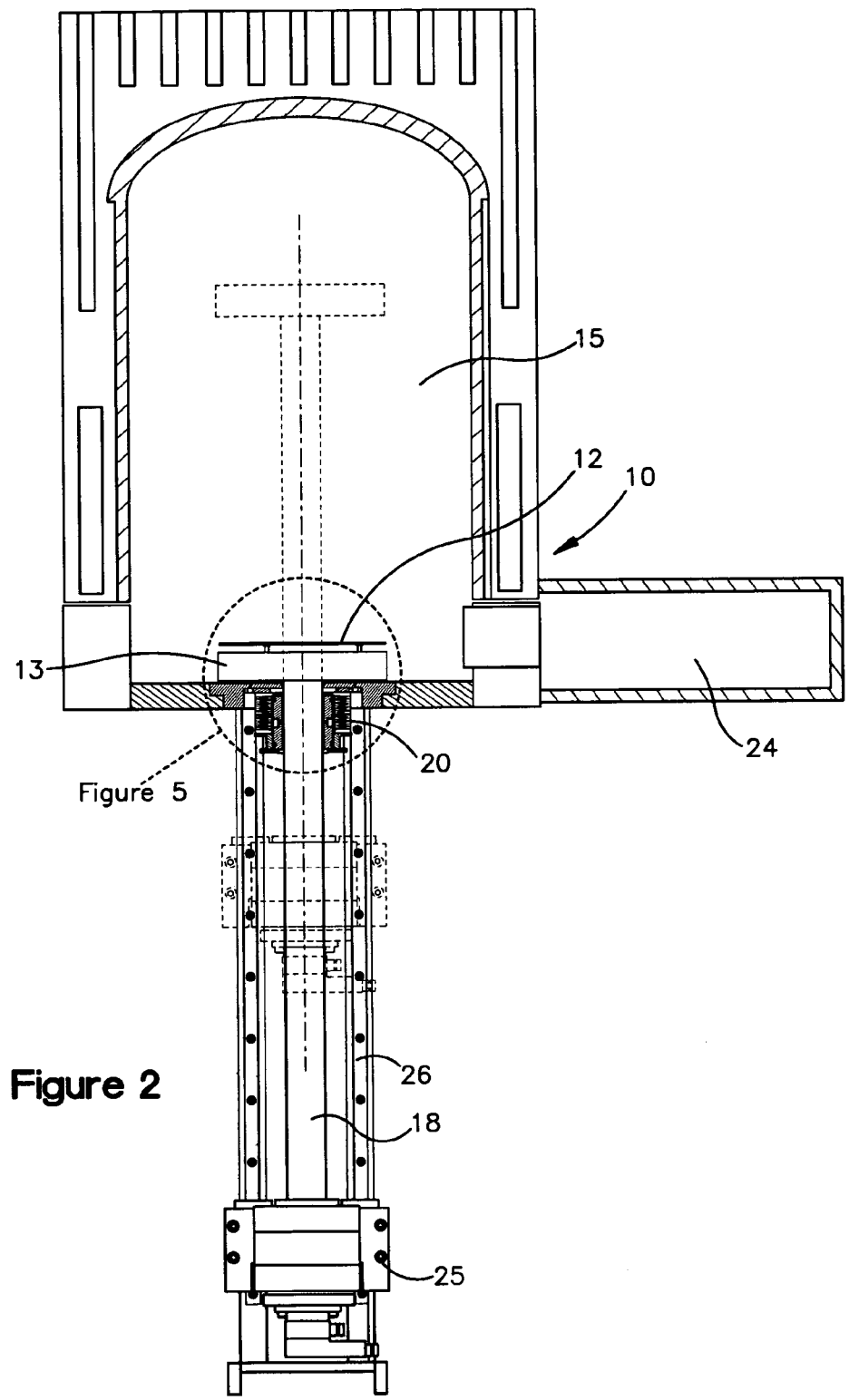
FIG. 2 is a cross sectional view of a rapid thermal processing unit suitable for practice of the present invention.

FIG. 2 illustrates a rapid thermal processing system 10 that uses a cylindrical hot wall system to thermally process semiconductor wafers. A wafer 12 is placed on a gas cushion wafer support 13 (shown in more detail in FIGS. 3–5) and is moved vertically through a process chamber having a temperature gradient created by heating elements behind the chamber walls as shown in phantom. The wafer support 12 is connected to an elevator tube assembly 18 that protrudes through an orifice in the chamber floor. The elevator tube is connected to a moveable carriage 25 that traverses a set of rails 26 to move the elevator tube 18 and wafer support 12 along a vertical excursion within the process chamber 15. A gas curtain is created within the gap between the outer diameter of the elevator tube and the orifice to prevent the passage of ambient air into the process chamber.

Referring now to FIG. 2 one embodiment of the gas cushion wafer support 13 is shown in more detail. A gas cushion plenum 30 is mounted to the top of the hollow quartz tube 18 and has an inlet orifice through which gas is supplied to the plenum through the quartz tube. Three wafer loading pins 45 slideingly protrude through the bottom of the plenum 30. Wafer cushioning plugs 43 on the top of each pin 45 seal the plenum when the support is moved through the processing chamber as well as provide a cushion interface between the pins and the wafer (see FIG. 4). When the bottom of the plenum 30 is in close proximity to the bottom of the processing chamber, the pins are pushed toward the workpiece as shown in FIG. 5 to lift the wafer above the plenum for unloading by a robotic arm (not shown). When the gas cushion is not activated, the wafer is supported by a support flange 34 that has an outer diameter slightly larger than the outer diameter of the wafer and located on the support flange by a locating wall 32.

Figure 3:
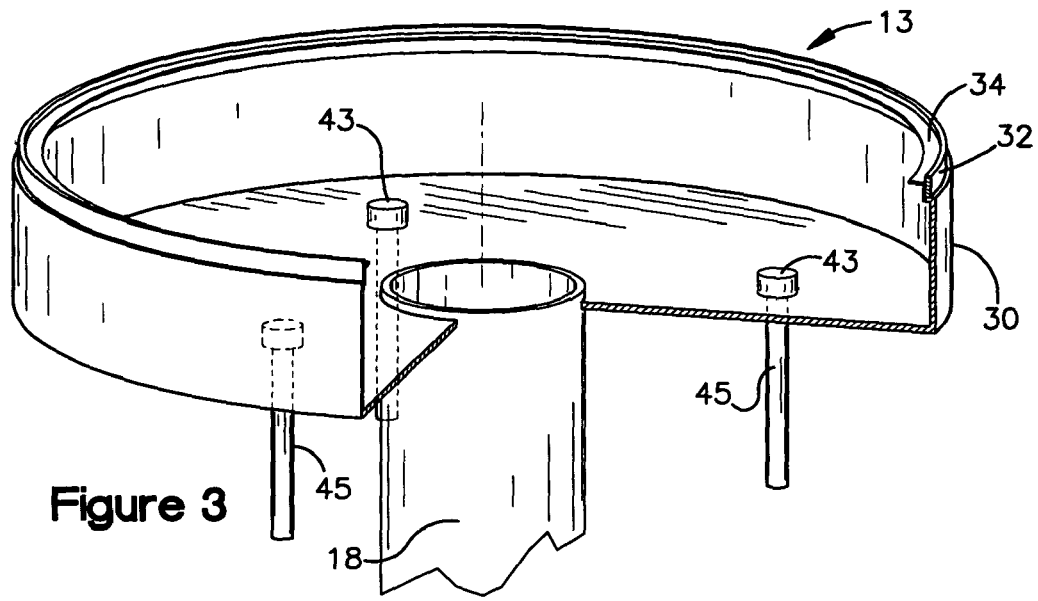
FIG. 3 is a perspective view of a gas cushion wafer support with a section removed to illustrate various features.
Figure 4:
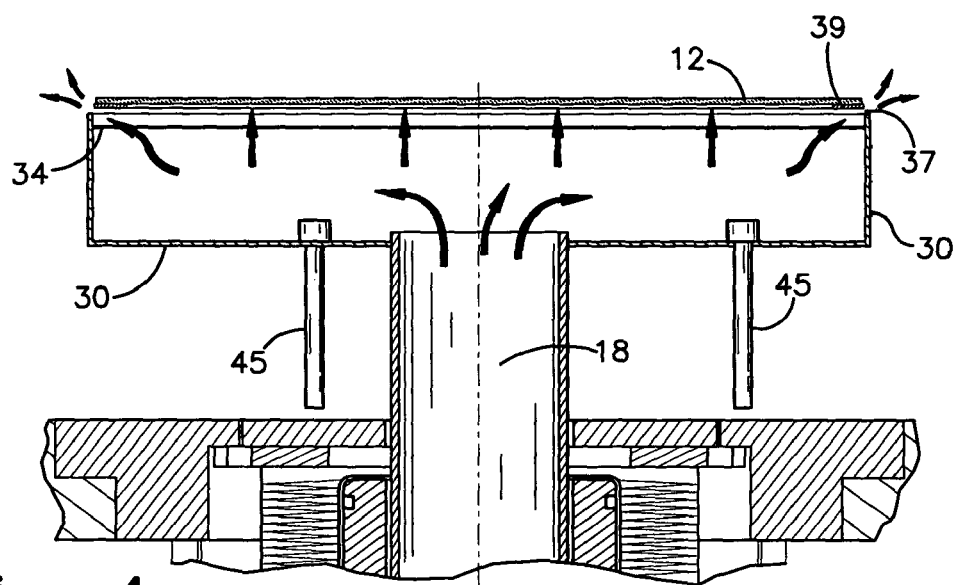
FIG. 4 is a cross section view of an alternative embodiment of gas cushion wafer support.
Figure 5:
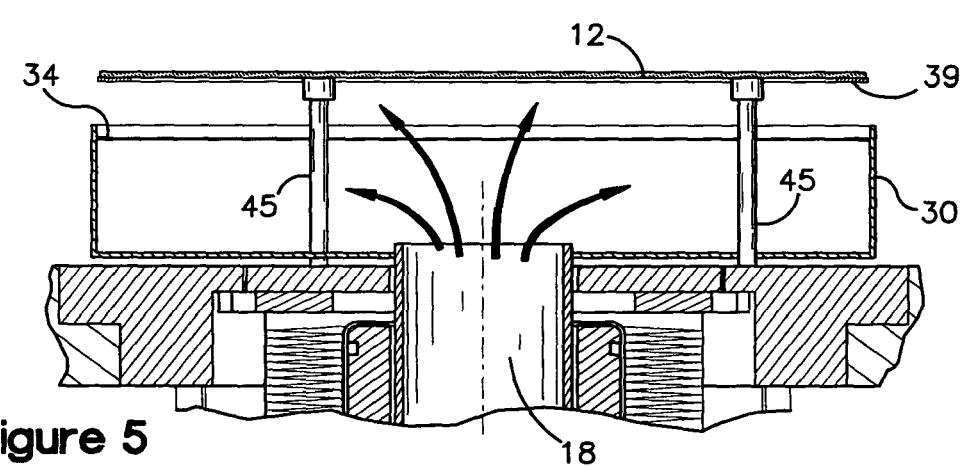
FIG. 5 is a cross section view of the gas cushion wafer support of FIG. 3 in a wafer load position.

FIGS. 3 and 4 illustrate a gas cushion wafer support 13 that includes an edge ring 39 that rests on the support flange 34. The edge ring has a much smaller mass than the wafer 12 and a slightly larger outer diameter than the wafer. The edge ring 39 damps the convection cooling effect from gas flowing through the annular orifice. The edge ring 39 also damps the effect of radiation heating from the heat source. Damping both of these effects near the wafer edge maintains a more uniform termperature across the wafer surface.

FIG. 5 shows a wafer 12 as it is positioned when it is first loaded onto the support 13. The robotic arm places the wafer on the loading pins 45. The quartz tube 18 then begins its upward excursion in the process chamber. As the support 13 moves away from the floor of the process chamber, the pins 45 drop through the bottom of the plenum 30 and the wafer rests on the edge ring 39 that in turn rests on the support flange 34 (see FIG. 4). When the wafer 12 is lowered into the plenum gas flow through the quartz tube then begins nd the gas pressure increases in the plenum until the wafer floats. Process chamber gas continuously flows through the interior 19 of the quartz tube and into the plenum 30. When the plenum 30 is becomes sufficiently pressurized with gas, the pressure lifts the wafer 12, and the edge ring 39 if it is used, and the gas escapes the plenum through a gap 37 between the wafer edge (or edge ring) and the support flange. As long a the supply gas flow is sufficient, the pressure will equalize at a level such that the wafer floats above the flange on a cushion of gas.

As can be seen from the foregoing description, the gas wafer support provides a uniform cushion for supporting a wafer during processing. Although the present invention has been described with a degree of particularity, it is the intent that the invention include all modifications and alterations from the disclosed design falling within the spirit or scope of the appended claims.

We claim:

1. An apparatus for supporting a thin, planar workpiece comprising;
    a plenum in fluid communication with a gas supply and comprising a workpiece support flange having an inner diameter slightly smaller than an outer diameter of the workpiece;
    an edge ring that movably rests on the support flange and contacts an outer edge of the workpiece and wherein the edge ring has an inner diameter slightly smaller than the outer diameter of the workpiece and an outer diameter slightly larger than an outer diameter of the workpiece and wherein when the workpiece is placed on the support flange an outer edge of the workpiece rests upon the edge ring; and
    wherein when a workpiece is placed on the support flange and gas is supplied to the plenum the edge ring is lifted by the gas in contact with the outer edge of the workpiece such that the inner diameter of the support flange coacts with an outer diameter of the edge ring to define a gas flow path through which the supplied gas flows when the edge ring and the workpiece is are lifted off the support flange.

2. The apparatus of claim 1 comprising locating structure disposed about a periphery of the plenum for locating the workpiece on the support flange.

3. The apparatus of claim 2 wherein the locating structure comprises a locating wall disposed in proximity to the support flange that maintains the workpiece location with respect to the support flange.

4. The apparatus of claim 1 comprising workpiece loading structure that lifts the workpiece above the support flange when the workpiece support is moved to a loading position.

5. The apparatus of claim 4 wherein the workpiece loading structure comprises a plurality of pins that protrude through a bottom surface of the plenum such that when the plenum is moved into close proximity to a process chamber surface the pins contact the surface such that as the workpiece support moves toward the surface the pins contact and lift the workpiece away from the support flange.

6. The apparatus of claim 5 wherein the pins comprise a seal at a first distal end that rests on the bottom surface of the plenum when the pins are not in contact with the process chamber surface.

7. An apparatus for supporting a thin, planar workpiece comprising;
    a plenum in fluid communication with a gas supply and comprising a workpiece support flange having an inner diameter slightly smaller than an outer diameter of the workpiece;
    locating structure disposed about a periphery of the support flange that maintains the workpiece location with respect to the support flange;
    a wafer edge ring that movably rests on the workpiece support flange and is maintained in position by the locating structure, the edge ring comprising an inner diameter slightly smaller than the outer diameter of the workpiece and an outer diameter slightly larger than the outer diameter of the workpiece; and
    wherein when a workpiece is placed on the edge ring and gas is supplied to the plenum the edge ring is lifted by the gas in contact with the outer edge of the workpiece such that the inner diameter of the support flange coacts with an outer diameter of the edge ring to define a gas flow path through which the supplied gas flows when the edge ring and the workpiece are lifted off the support flange.

8. The apparatus of claim 7 comprising workpiece loading structure that lifts the workpiece above the support flange when the workpiece support is moved to a loading position.

9. The apparatus of claim 7 wherein the workpiece loading structure comprises a plurality of pins that protrude through a bottom surface of the plenum such that when the plenum is moved into close proximity to a process chamber surface the pins contact the surface such that as the workpiece support moves toward the surface the pins contact and lift the workpiece away from the support flange and wherein the pins comprise a seal at a first distal end that rests on the bottom surface of the plenum when the pins are not in contact with the process chamber surface.

* * * * *